(12) United States Patent
Jiang

(10) Patent No.: US 12,328,099 B2
(45) Date of Patent: Jun. 10, 2025

(54) APPARATUS AND METHODS FOR LOCAL OSCILLATOR INTERFACE CIRCUITS WITH QUADRATURE CLOCK GENERATION AND PHASE CORRECTION

(71) Applicant: Analog Devices, Inc., Wilmington, MA (US)

(72) Inventor: Xuesong Jiang, Princeton, NJ (US)

(73) Assignee: Analog Devices, Inc., Wilmington, MA (US)

( * ) Notice: Subject to any disclaimer, the term of this patent is extended or adjusted under 35 U.S.C. 154(b) by 118 days.

(21) Appl. No.: 18/173,327

(22) Filed: Feb. 23, 2023

(65) Prior Publication Data

US 2024/0291431 A1 Aug. 29, 2024

(51) Int. Cl.
  *H03B 5/12* (2006.01)
  *H03B 5/24* (2006.01)
  *H03B 5/36* (2006.01)

(52) U.S. Cl.
  CPC ............... *H03B 5/124* (2013.01); *H03B 5/24* (2013.01); *H03B 5/366* (2013.01)

(58) Field of Classification Search
  CPC .......... H03B 5/124; H03B 5/24; H03B 5/366; H03B 27/00; H03K 5/15; H03H 11/22
  See application file for complete search history.

(56) References Cited

U.S. PATENT DOCUMENTS

| | | | |
|---|---|---|---|
| 5,121,069 A | 6/1992 | Burns et al. | |
| 5,408,135 A | 4/1995 | Choi et al. | |
| 5,696,796 A | 12/1997 | Poklemba | |
| 5,986,483 A | 11/1999 | Yu et al. | |
| 6,097,259 A | 8/2000 | Saito et al. | |
| 6,356,124 B1 | 3/2002 | Schoch | |
| 6,462,789 B1 | 10/2002 | Zoso et al. | |
| 6,587,862 B1 | 7/2003 | Henderson | |
| 6,700,367 B1 | 3/2004 | Santos et al. | |
| 6,950,485 B2 | 9/2005 | Richards et al. | |

(Continued)

FOREIGN PATENT DOCUMENTS

EP 1786101 A2 5/2007

OTHER PUBLICATIONS

Extended European Search Report for Application No. 24156447.5 dated Jul. 31, 2024 in 6 pages.

(Continued)

*Primary Examiner* — Jeffrey M Shin
(74) *Attorney, Agent, or Firm* — Knobbe, Martens, Olson & Bear, LLP

(57) ABSTRACT

Apparatus and methods for oscillator interface circuits with quadrature clock generation and phase correction are disclosed. In certain embodiments, a clock system includes an external oscillator that provides a differential input clock signal, and a semiconductor die that includes a first pin that receives a non-inverted component of the differential input clock signal and a second pin that receives an inverted component of the differential input clock signal. The semiconductor die further includes an oscillator interface circuit that includes a first controllable resistor and a first controllable capacitor connected in series between the first pin and the second pin, and a second controllable resistor and a second controllable capacitor connected in series between the second pin and the first pin.

17 Claims, 9 Drawing Sheets

(56) References Cited

U.S. PATENT DOCUMENTS

| | | | |
|---|---|---|---|
| 7,577,695 | B2 | 8/2009 | Dai |
| 7,772,932 | B1 | 8/2010 | Mack |
| 8,065,553 | B2 | 11/2011 | Tamura et al. |
| 8,760,209 | B2 | 6/2014 | Schell et al. |
| 10,389,572 | B2 | 8/2019 | Mao et al. |
| 11,101,782 | B1 | 8/2021 | Abdelsalam et al. |
| 11,271,710 | B1* | 3/2022 | Cho ................ H03B 27/00 |
| 2007/0100927 | A1 | 5/2007 | Park et al. |
| 2013/0266103 | A1 | 10/2013 | Bae et al. |
| 2014/0086364 | A1* | 3/2014 | Schell ............. H03B 27/00 |
| | | | 455/259 |
| 2023/0253996 | A1* | 8/2023 | Shibata ........... H04B 1/0483 |
| | | | 455/552.1 |

OTHER PUBLICATIONS

Analog Devices, Inc., ADRV9001 System Development User Guide UG-1828, System Development User Guide for the RF Agile Transceiver Family, Oct. 2021, in 338 pages.

Kaukovuori, Analysis and Design of Passive Polyphase Filters, IEEE Transactions on Circuits and Systems, I: Regular Papers, vol. 55, No. 10, Nov. 2008, p. 3023-3037.

Zhang et al., "A Precision Wideband Quadrature Generation Technique with Feedback Control for Millimeter-Wave Communication Systems," Jan. 2018, IEEE Transactions on Theory and Techniques, in 12 pages.

\* cited by examiner

APPARATUS AND METHODS FOR LOCAL OSCILLATOR INTERFACE CIRCUITS WITH QUADRATURE CLOCK GENERATION AND PHASE CORRECTION

FIELD OF THE DISCLOSURE

Embodiments of the invention relate to electronics, and more particularly, to oscillator interface circuits.

BACKGROUND

Electronic oscillators, such as voltage-controlled oscillators (VCOs), are widely used in electronic and communication applications, such as radio transceivers, clock generation and distribution, and data recovery. VCOs can include an oscillator core that generates an oscillating output signal and a resonator (for example, an inductor-capacitor tank) that presents the oscillator core with variable electrical characteristics such as capacitance and/or inductance. The frequency of oscillation depends at least partly on the value of the variable electrical characteristics, and thus tuning the resonator provides a way to control the frequency of oscillation of the output signal.

In certain applications, a VCO or other controllable oscillator is external to a semiconductor die. Additionally, the semiconductor die includes an oscillator interface circuit for interfacing with the oscillator.

SUMMARY OF THE DISCLOSURE

Apparatus and methods for oscillator interface circuits with quadrature clock generation and phase correction are disclosed. In certain embodiments, a clock system includes an external oscillator that provides a differential input clock signal, and a semiconductor die that includes a first pin that receives a non-inverted component of the differential input clock signal and a second pin that receives an inverted component of the differential input clock signal. The semiconductor die further includes an oscillator interface circuit that includes a first controllable resistor and a first controllable capacitor connected in series between the first pin and the second pin, and a second controllable resistor and a second controllable capacitor connected in series between the second pin and the first pin.

In one aspect, a semiconductor die includes a first pin configured to receive a non-inverted component of a differential input clock signal from an oscillator external to the semiconductor die, a second pin configured to receive an inverted component of the differential input clock signal, and an oscillator interface circuit including a first controllable resistor and a first controllable capacitor connected in series between the first pin and the second pin, and a second controllable resistor and a second controllable capacitor connected in series between the second pin and the first pin.

In another aspect, a method of clock processing includes receiving, at a first pin of a semiconductor die, a non-inverted component of a differential input clock signal from an oscillator that is external to the semiconductor die, receiving, at a second pin of the semiconductor die, an inverted component of the differential input clock signal from the oscillator, and processing the differential input clock signal using an oscillator interface circuit of the semiconductor die. The oscillator interface circuit includes a first controllable resistor and a first controllable capacitor connected in series between the first pin and the second pin, and a second controllable resistor and a second controllable capacitor connected in series between the second pin and the first pin.

In another aspect, a clock system includes an oscillator configured to provide a differential input clock signal, and a semiconductor die including a first pin configured to receive a non-inverted component of the differential input clock signal, a second pin configured to receive an inverted component of the differential input clock signal, and an oscillator interface circuit including a first controllable resistor and a first controllable capacitor connected in series between the first pin and the second pin, and a second controllable resistor and a second controllable capacitor connected in series between the second pin and the first pin.

DETAILED DESCRIPTION OF EMBODIMENTS

Figure 1:
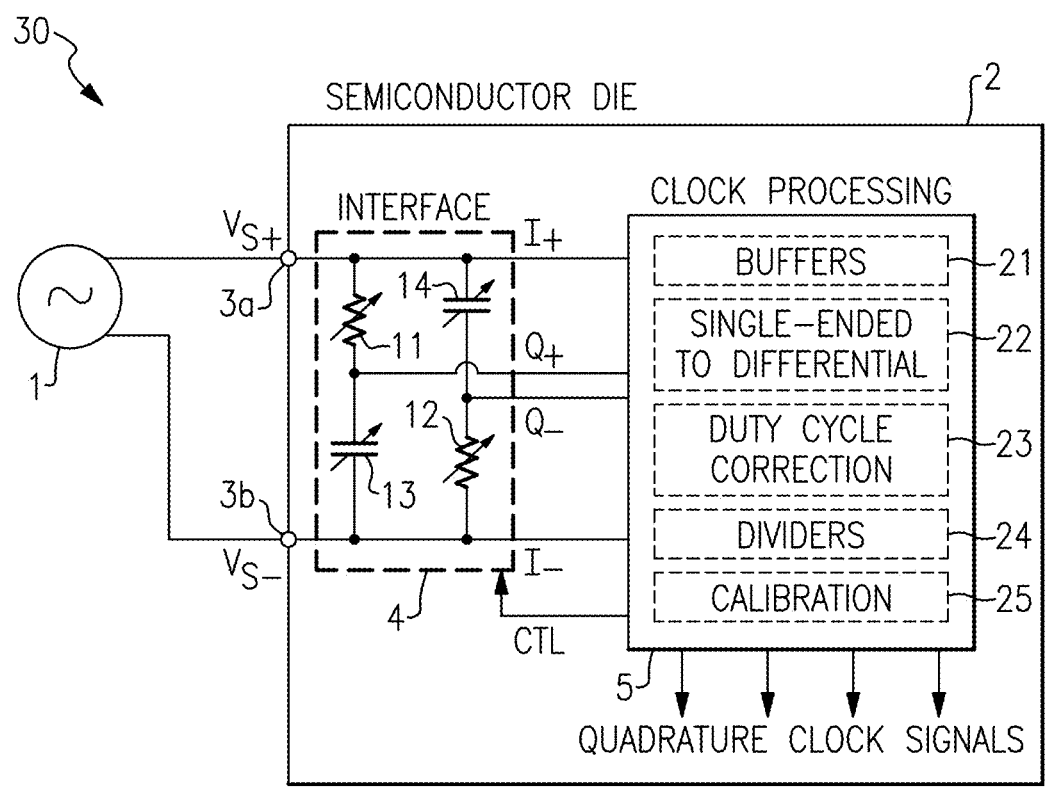
FIG. 1 is a schematic diagram of one embodiment of a clock system with an interface between a semiconductor die and an external oscillator.

The following detailed description of embodiments presents various descriptions of specific embodiments of the invention. However, the invention can be embodied in a multitude of different ways. In this description, reference is made to the drawings where like reference numerals may indicate identical or functionally similar elements. It will be understood that elements illustrated in the figures are not necessarily drawn to scale. Moreover, it will be understood that certain embodiments can include more elements than illustrated in a drawing and/or a subset of the elements illustrated in a drawing. Further, some embodiments can incorporate any suitable combination of features from two or more drawings.

Quadrature clock signals can be desirable for a wide range of applications. In one example, a transceiver includes a local oscillator (LO) that generates an in-phase (I) clock signal and a quadrature-phase (Q) clock signal, which are quadrature clock signals with an ideal phase separation of 90 degrees. The transceiver also includes mixers that use the quadrature clock signals from the LO to provide frequency upconversion and/or downconversion.

A controllable oscillator, such as a voltage controlled oscillator (VCO), can provide an input clock signal used to generate quadrature clock signals. For example, quadrature clock signals can be generated from an input clock signal using a polyphase filter or other quadrature clock generation circuit.

In some applications, a VCO or other controllable oscillator is external to a semiconductor die that includes quadrature clock generation circuit. For example, using an external VCO can be desirable in applications with stringent phase noise specifications, such as those in which a radio frequency phase-locked loop (RFPLL) with integrated VCO provides insufficient phase noise performance.

Conventional quadrature clock generation circuits that use an input clock signal from an external oscillator suffer from a number of limitations. For example, certain quadrature clock generation circuits require that the input clock signal is at least twice the frequency of the generated quadrature clock signals. Furthermore, quadrature clock generation circuits can suffer from high power, narrow operating frequency range, and/or large area. Moreover, quadrature clock generation circuits can cause degradations in external clock signal quality, constrain the drive strength of the external oscillator, and/or offer limited tunability.

Apparatus and methods for oscillator interface circuits with quadrature clock generation and phase correction are disclosed. In certain embodiments, a clock system includes an external oscillator that provides a differential input clock signal, and a semiconductor die that includes a first pin that receives a non-inverted component of the differential input clock signal and a second pin that receives an inverted component of the differential input clock signal. The semiconductor die further includes an oscillator interface circuit that includes a first controllable resistor and a first controllable capacitor connected in series between the first pin and the second pin, and a second controllable resistor and a second controllable capacitor connected in series between the second pin and the first pin.

Accordingly, a parallel combination of a resistor-capacitor (RC) low pass filter and a capacitor-resistor (CR) high pass filter is connected between the pins that receive the differential input clock signal from the external oscillator. Such a filtering structure is referred to herein as an RC-CR filter stage.

The I clock path can include a first clock buffer driven by the external oscillator directly. Additionally, the Q clock path includes the RC-CR filter followed by a second clock buffer (which can be the same design as the first clock buffer). Since the I clock path does not include the RC-CR filter stage, jitter/phase noise performance is preserved in many operational modes, such as when the frequency of the external oscillator is at least twice the quadrature clock signal frequency.

The RC-CR filter is tunable with programmable values for R and C. Additionally, the phase of the quadrature output clock signals depends on the 0 degree positive input of the differential input clock signal, the 180 degree negative input of the differential input clock signal, and the phase shift due to the filter. Additionally, the accuracy of the quadrature clock phase is set by the least significant bit (LSB) step size of the R and C values.

The R and C values can be calibrated using foreground and/or background calibration to ensure the quadrature clock phase accuracy. The calibration makes the phase accuracy of the generated clock insensitive to amplitude and phase imbalance of the differential input clock signal.

In certain implementations, the oscillator interface circuit is operable in one of multiple modes, including a differential mode in which the RC-CR filter generates differential quadrature clock signals. The oscillator interface circuit is also operable in a single-ended mode in which a single-ended quadrature clock signal is generated from the RC low-pass filter or the CR high pass filter first, and later converted to a differential quadrature clock signal using any suitable single-ended to differential conversion circuit.

Such an arrangement is beneficial as it allows a simple programmable RC filter for quadrature clock generation with low power and a wide input frequency range (for example, over a frequency range of at least 250 MHz to 1 GHz). Such an arrangement also provides a very small amount of clock attenuation for low jitter, and is highly flexible with high performance and low power as a design target without degrading the quality of the I and Q clocks generated from a high quality external clock source.

Furthermore, calibration of this arrangement is simpler, and non-idealities from the on-chip single-ended to differential conversion are more predictable and controllable than those from external components, such as a balun. Moreover, the circuit is robust against input amplitude and phase imbalance, component mismatch, and layout non-idealities by way of correction through calibration.

The interface circuit can generate quadrature clock signals with a differential input clock signal at the same frequency. Additionally, to accommodate high input frequencies, dividers can be included to generate quadrature clock signals by dividing down the input frequency (for instance, with even number division ratios). Duty cycle correction circuit is incorporated in the design to improve phase accuracy of the quadrature clock. The interface circuit provides excellent performance in a compact circuit area or footprint.

The clock interface circuit also supports operation with a single-ended input clock signal when the frequency of the input clock signal at least doubles the quadrature clock signal frequency to be generated.

The clock interface circuits herein can be used to generate quadrature LO clock signals over a wide frequency range, and thus are suitable for transceiver applications. Moreover, the interface allows for flexible re-configurability to support a wide range of LO frequency generation schemes. Furthermore, the programmability of the resistor and capacitor components relaxes constraints on the amplitude and phase imbalance of the differential input clock, and thus on the external oscillator.

FIG. 1 is a schematic diagram of one embodiment of a clock system 30 with an interface between a semiconductor die 2 and an external oscillator 1. In some applications, such as those with stringent phase noise specifications, it is desirable for the oscillator 1 to be external to the semiconductor die 2 rather than integrated thereon.

As shown in FIG. 1, the external oscillator 1 (for example, a VCO) provides a differential input clock signal to the semiconductor die 2. In particular, a non-inverted component $V_{S+}$ of the differential input clock signal is provided to a first pin 3a of the semiconductor die 2, while an inverted component $V_{S-}$ of the differential input clock signal is provided to a second pin 3b of the semiconductor die 2.

In the illustrated embodiment, the semiconductor die 2 further includes an oscillator interface circuit 4 for interfacing with the external oscillator 1, and a clock processing circuit 5 for processing clock signals from the oscillator interface circuit 4.

The oscillator interface circuit 4 includes a first controllable resistor 11 and a first controllable capacitor 13 connected in series between the first pin 3a and the second pin 3b to form an RC low pass filter, and a second controllable resistor and a second controllable capacitor connected in series between the second pin 3b and the first pin 3a to form a CR high pass filter. The resulting filtering structure is referred to herein as an RC-CR filter stage.

The clock processing circuit 5 includes a non-inverted I input (I+) connected to the first pin 3a, a non-inverted Q input (Q+) connected to a first node between the first controllable resistor 11 and the first controllable capacitor 13, an inverted Q input (Q−) connected to a second node between the second controllable resistor 12 and the second controllable capacitor 14, and an inverted I input (I−) connected to the second pin 3b.

Accordingly, the I clock path to the clock processing circuit 5 is driven by the external oscillator 1 directly. Additionally, the quadrature clock path to the clock processing circuit 5 is through the RC-CR filter. Since the I clock path does not include the RC-CR filter stage, jitter/phase noise performance is preserved in many operational modes, such as when the frequency of the external oscillator 1 is at least twice the quadrature clock signal frequency.

As shown in FIG. 1, the clock processing circuit 5 includes buffers 21 for buffering clock signals from the oscillator interface circuit 4, and single-ended to differential conversion circuitry 22 for converting singled-ended signals from the oscillator interface circuit 4 (which can be after buffering by the buffers 21) to differential signals. The clock processing circuit 5 further includes dividers 24 for providing any desired frequency division, and calibration 25 for calibrating resistor and capacitance values of the oscillator interface circuit 4. The clock processing circuit 5 further includes duty cycle correction 23 for correcting for quadrature error in the generated quadrature clock signals, for example, in a division mode (for instance, a divide by two mode) to correct the duty cycle error of the input clock signal (for instance, external VCO clock), thus correcting quadrature error in the generated quadrature clock signals. For example, duty cycle error of the input clock signals becomes I-Q quadrature clock phase error after the dividers 24 provide divide by two division.

The RC-CR filter is tunable with programmable values for R and C, which are set by a control signal CTL from the clock processing circuit 5. For example, the calibration circuit 5 can set the values for R and C using a foreground calibration and/or a background calibration. The phase of the quadrature output clock signals depends on the 0 degree positive input of the differential input clock signal, the 180 degree negative input of the differential input clock signal, and the phase shift due to the filter. Additionally, the accuracy of the quadrature clock phase is set by the LSB step size of the R and C values. The calibration makes the phase accuracy of the generated clock insensitive to amplitude and phase imbalance of the differential input clock signal. Thus, good I/Q matching can be achieved.

In certain implementations, the calibrations use the same value of R for each of the first controllable resistor 11 and the second controllable resistor 12, and the same value of C for each of the first controllable capacitor 13 and the second controllable capacitor 14. However, implementations with different R values for each resistor (for instance, offset resistance codes to accommodate for mismatch) and/or with different C values for each capacitor are possible.

In certain implementations, the oscillator interface circuit 4 is operable in one of multiple modes, including a differential mode in which the RC-CR filter generates differential quadrature clock signals. The oscillator interface circuit is also operable in a single-ended mode in which a single-ended quadrature clock signal is generated from the RC low-pass filter or the CR high pass filter first, and later converted to a differential quadrature clock signal using the single-ended to differential conversion circuitry 22.

Such an arrangement is beneficial as it allows a simple programmable RC filter for quadrature clock generation to allow coverage of a wide input frequency range. Such an arrangement also provides a very small amount of clock attenuation for low jitter, and is highly flexible with high performance and low power as a design target without degrading the quality of the I and Q clocks generated from a high quality external clock source.

Figure 2:
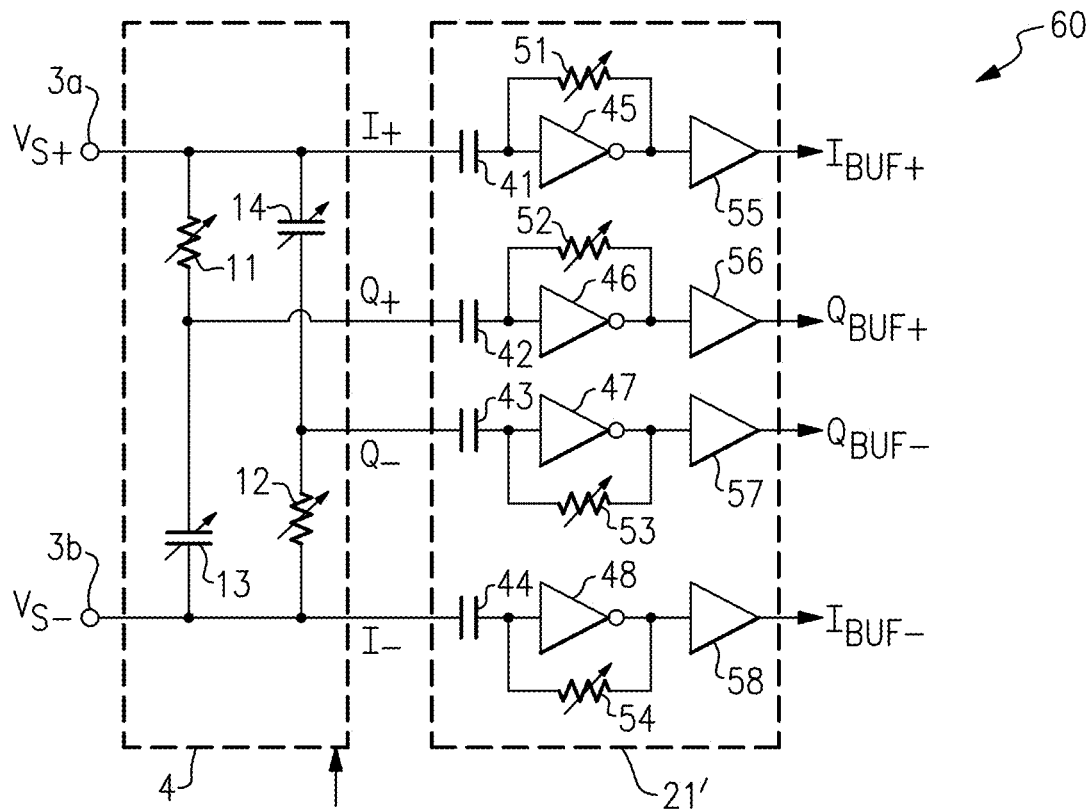
FIG. 2 is a schematic diagram of an oscillator interface with buffering according to one embodiment.

FIG. 2 is a schematic diagram of an oscillator interface 60 with buffering 21' according to one embodiment. The oscillator interface 60 depicts an example implementation of the buffers 21 of FIG. 1. However, the buffers 21 of FIG. 1 can be implemented in other ways.

In the illustrated embodiment, the buffers include a first DC block capacitor 41, a second DC blocking capacitor 42, a third DC blocking capacitor 43, a fourth DC blocking capacitor 44, a first inverting amplifier (inverter) 45, a second inverter 46, a third inverter 47, a fourth inverter 48, a first controllable feedback resistor 51, a second controllable feedback resistor 52, a third controllable feedback resistor 53, a fourth controllable feedback resistor 54, a first output amplifier 55, a second output amplifier 56, a third output amplifier 57, and a fourth output amplifier 58.

As shown in FIG. 2, the first inverter 45 includes an input connected to the first pin 3a through the first DC blocking capacitor 41, and the first controllable feedback resistor 51 is connected between an output of the first inverter 45 and the input of the first inverter 45. Additionally, the first output amplifier 55 buffers the output of the first inverter 45 to generate a non-inverted buffered I signal ($I_{BUF+}$). The second inverter 46 includes an input connected to the output of the RC low pass filter through the second DC blocking capacitor 42, and the second controllable feedback resistor 52 is connected between an output of the second inverter 46 and the input of the second inverter 46. Additionally, the second output amplifier 56 buffers the output of the second inverter 46 to generate a non-inverted buffered Q signal ($Q_{BUF+}$).

Furthermore, the third inverter 47 includes an input connected to the output of the CR high pass filter through the third DC blocking capacitor 43, and the third controllable feedback resistor 53 is connected between an output of the third inverter 47 and the input of the third inverter 47. Additionally, the third output amplifier 57 buffers the output of the third inverter 47 to generate an inverted buffered Q signal ($Q_{BUF-}$). The fourth inverter 48 includes an input connected to the second pin 3b through the fourth DC blocking capacitor 44, and the fourth controllable feedback resistor 54 is connected between an output of the fourth inverter 48 and the input of the fourth inverter 48. Additionally, the fourth output amplifier 58 buffers the output of the fourth inverter 48 to generate an inverted buffered I signal ($I_{BUF-}$).

Figure 3:
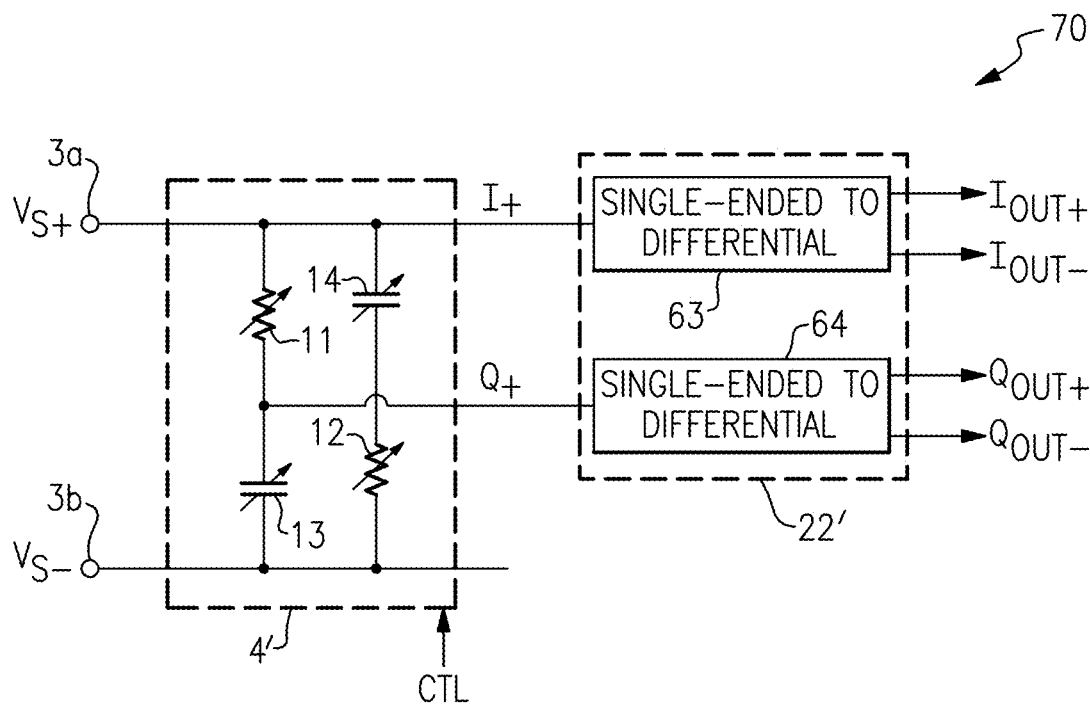
FIG. 3 is a schematic diagram of an oscillator interface with single-ended to differential conversion according to one embodiment.

FIG. 3 is a schematic diagram of an oscillator interface 70 with single-ended to differential conversion 22' according to one embodiment. The oscillator interface 70 depicts an example implementation of the single-ended to differential conversion circuitry 22 of FIG. 1. However, other implementations are possible.

In the illustrated embodiment, the oscillator interface circuit 4' is operated in a single-ended mode in which the signal $V_{S+}$ of the first pin 3a is provided to a first single-ended to differential conversion circuit 63, and the output of the RC low pass filter is provided to a second single-ended to differential conversion circuit 64. Additionally, the first single-ended to differential conversion circuit 63 generates a differential I output clock signal $I_{OUT+}/I_{OUT-}$, while the second single-ended to differential conversion circuit 64 generates a differential Q output clock signal $Q_{OUT+}/Q_{OUT-}$.

In certain implementations, an oscillator interface circuit is operable in one of multiple modes, including a differential mode in which the RC-CR filter generates differential quadrature clock signals. The oscillator interface circuit is also operable in a single-ended mode in which a single-ended quadrature clock signal is generated from the RC low-pass filter or the CR high pass filter first, and later converted to a differential quadrature clock signal using a single-ended to differential conversion circuit.

Such an arrangement is beneficial as it allows a simple programmable RC filter for quadrature clock generation to allow coverage of a wide input frequency range. Such an arrangement also provides a very small amount of clock attenuation for low jitter, and is highly flexible with high performance and low power as a design target without degrading the quality of the I and Q clocks generated from a high quality external clock source.

Figure 4A:
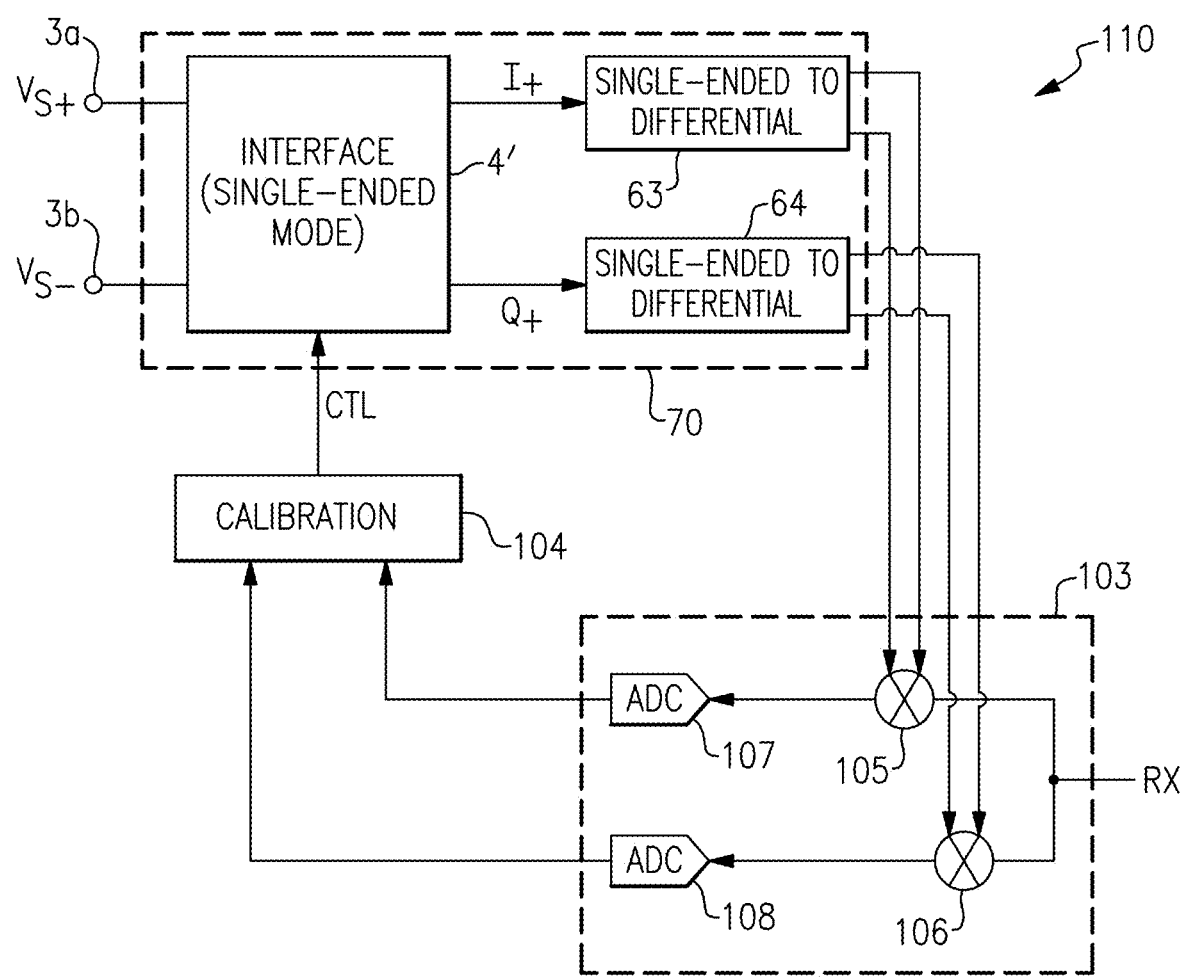
FIG. 4A is a schematic diagram of an oscillator interface with calibration according to one embodiment.

FIG. 4A is a schematic diagram of an oscillator interface 110 with calibration according to one embodiment. Although FIG. 4A depicts one example of a calibration scheme for an oscillator interface circuit, other implementations of calibration are possible.

In the illustrated embodiment, the oscillator interface circuit 4' is operated in a configuration similar to FIG. 3 in which a single-ended mode is used. Additionally, the single-ended to differential conversion circuits 63/64 generate quadrature clock signals for the receiver channel 103.

As shown in FIG. 4A, the receiver channel 103 includes an I-path mixer 105, an I-path analog-to-digital converter (ADC) 107, a Q-path mixer 106, and a Q-path ADC 108. The I-path mixer 105 downconverts a receive signal RX based on a differential I output clock signal from the first single-ended to differential conversion circuit 63, while the Q-path mixer 106 downconverts the receive signal RX based on a differential Q output clock signal from the second single-ended to differential conversion circuit 64. The I baseband signal from the I-path mixer 105 is processed by the first ADC 107 to generate a first digital observation signal for the calibration circuit 104, while the Q baseband signal from the Q-path mixer 106 is processed by the second ADC 108 to generate a second digital observation signal for the calibration circuit 104.

The calibration circuit 104 compares the first digital observation signal and the second digital observation signal to set the value of the control signal CTL to suitable R and C values.

Figure 4B:
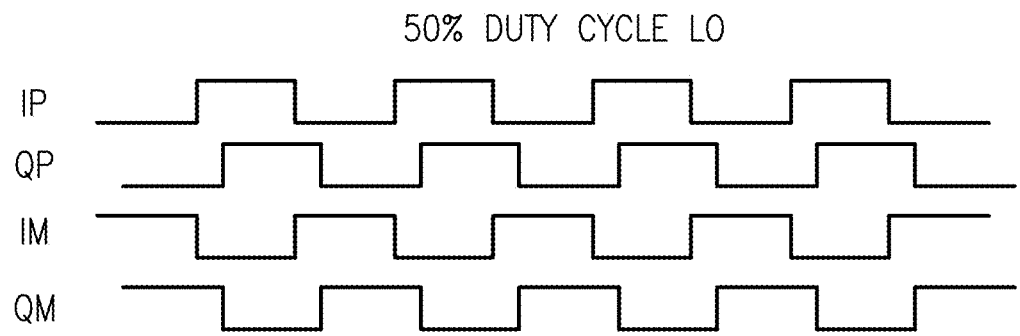
FIG. 4B is one example of clock waveforms for a 50% duty cycle local oscillator.
Figure 4C:
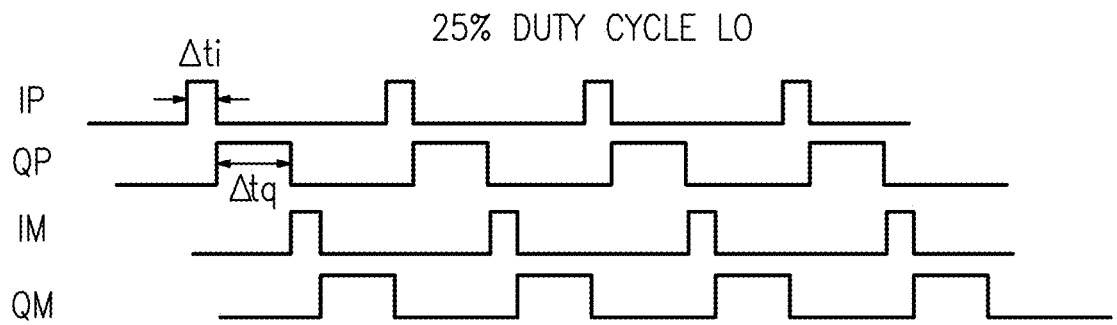
FIG. 4C is one example of clock waveforms for a 25% duty cycle local oscillator.
Figure 4D:
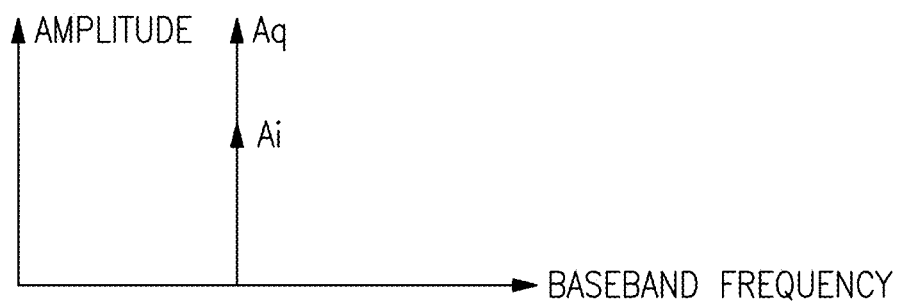
FIG. 4D is one example of a plot of amplitude versus baseband frequency.

FIG. 4B is one example of clock waveforms for a 50% duty cycle local oscillator. FIG. 4C is one example of clock waveforms for a 25% duty cycle local oscillator. FIG. 4D is one example of a plot of amplitude versus baseband frequency.

FIGS. 4B through 4D depict example waveforms associated with calibration according to FIG. 4A. For example, in this embodiment, a 25% duty cycle LO clock signal is generated from 50% duty cycle LO clocks. Thus, phase mismatch between the 50% duty cycle I and Q LO outputs becomes a pulse width mismatch between 25% duty cycle I and Q LO clocks. Such a mismatch appears as an amplitude mismatch between I and Q baseband signals.

Since the relationship between capacitor code and baseband amplitudes for I and Q are monotonic, the calibration circuit 103 can search for a capacitor code that achieves the smallest value of |Ai−Aq|.

The single-ended calibration scheme of FIG. 4A is easier to implement and more practical than multiple objective calibration with 4 outputs. For example, multiple output calibration with 4 outputs may not achieve good I/Q matching and/or find an optimal or even good performance point for setting the R and C values.

Figure 4E:
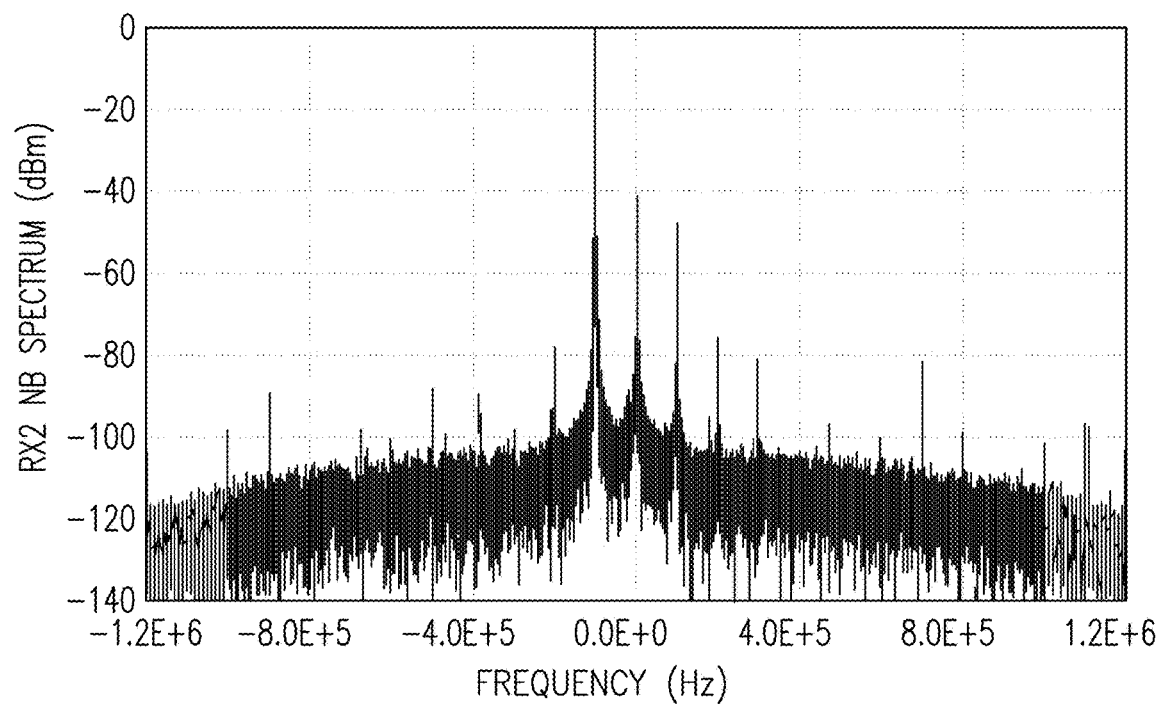
FIG. 4E is one example of a plot of receive spectrum versus frequency.

FIG. 4E is one example of a plot of receive spectrum versus frequency. The example is depicted for 3-bit resistance tuning, 7-bit coarse capacitance tuning, and 5-bit fine capacitance tuning. The measured receive (RX) spectrum is shown for a frequency of 846.4 MHz. Residual phase error post calibration is less than 0.5 degrees, and −45 dB receive image rejection is achieved with external LO calibration only, with further performance enhancements achievable when used in combination with other quadrature error correction (QEC) techniques.

An example of a manual lab calibration for receive image rejection is shown below with reference to FIGS. 4F to 4I. Calibration results are shown for three temperatures.

Figure 4F:
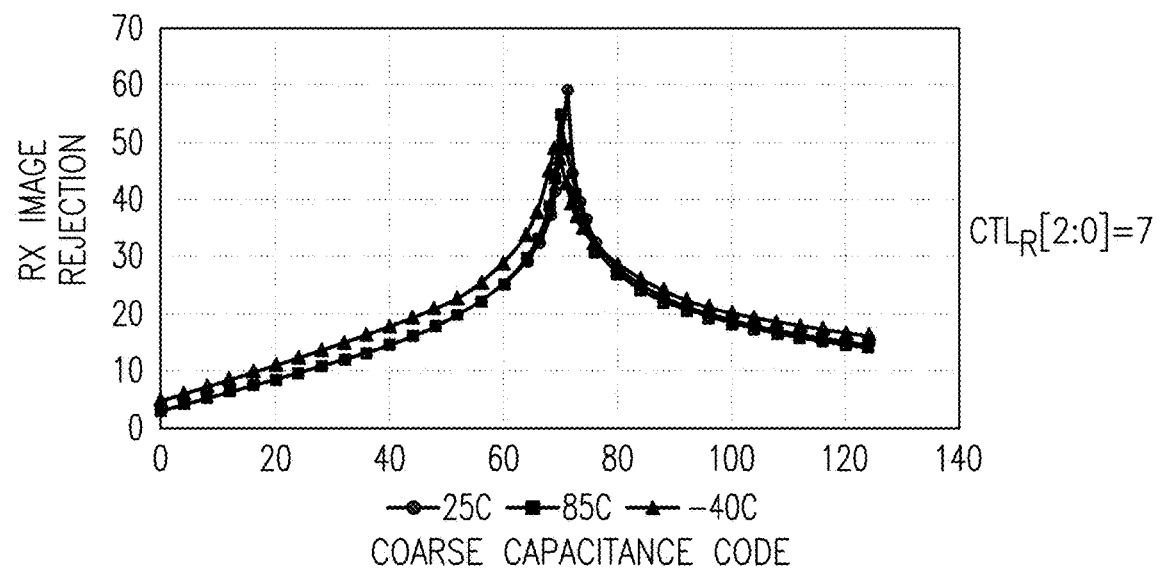
FIG. 4F is an example plot of receive image rejection versus coarse capacitance code for a resistance setting of seven.
Figure 4G:
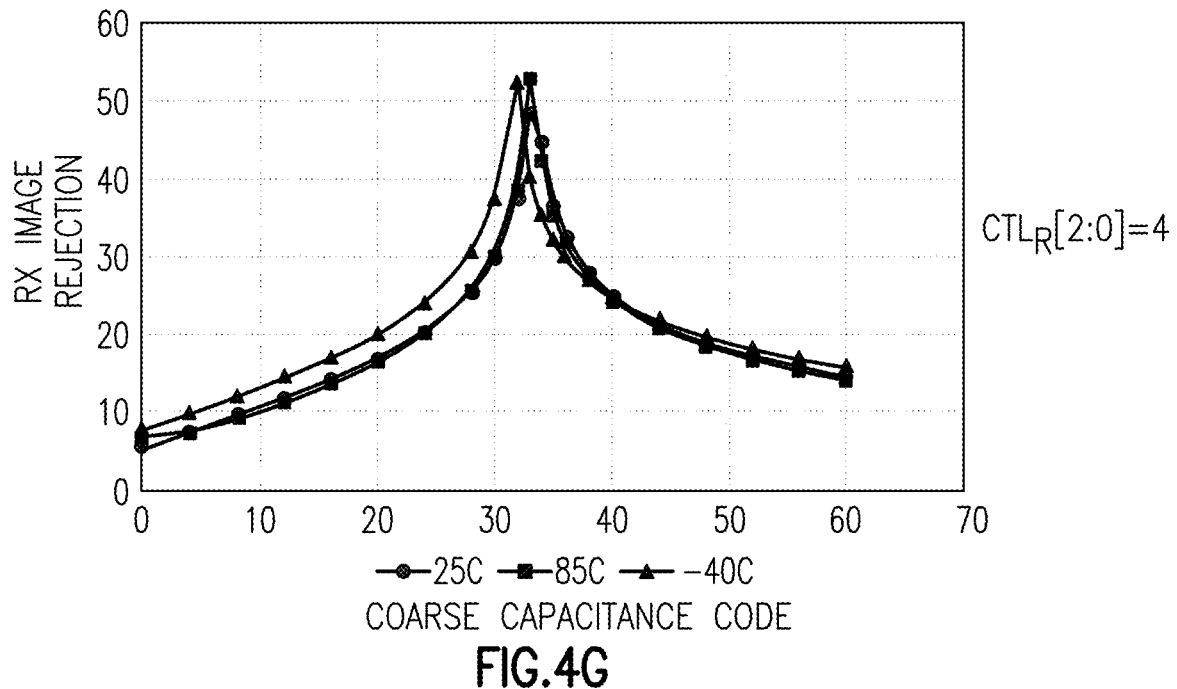
FIG. 4G is an example plot of receive image rejection versus coarse capacitance code for a resistance setting of four.
Figure 4H:
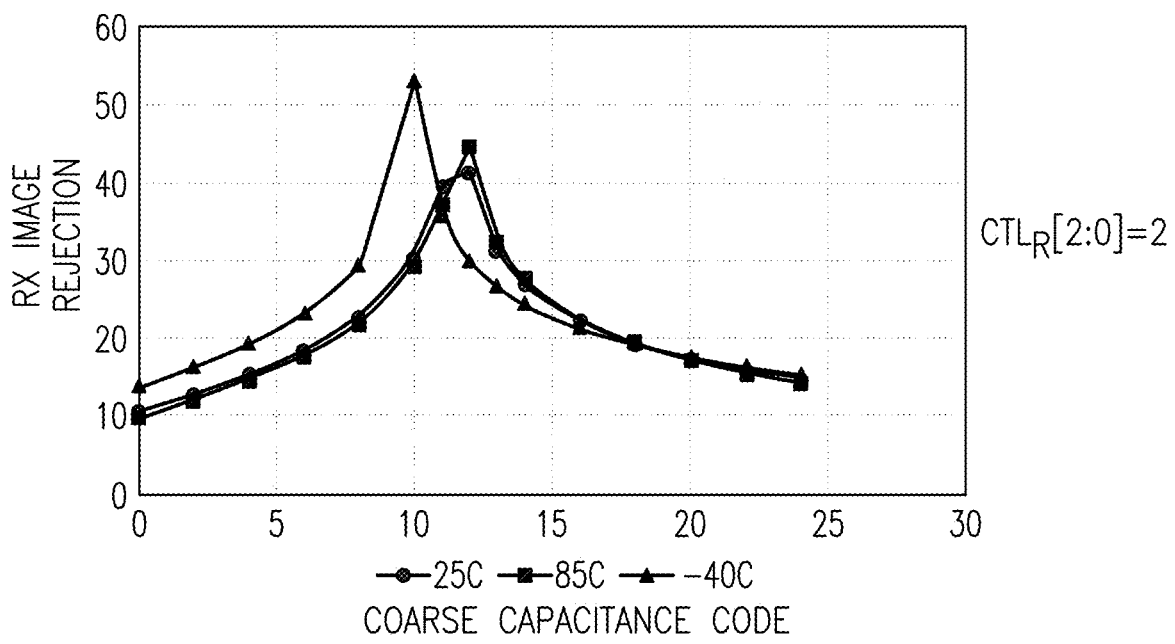
FIG. 4H is an example plot of receive image rejection versus coarse capacitance code for a resistance setting of two.
Figure 4I:
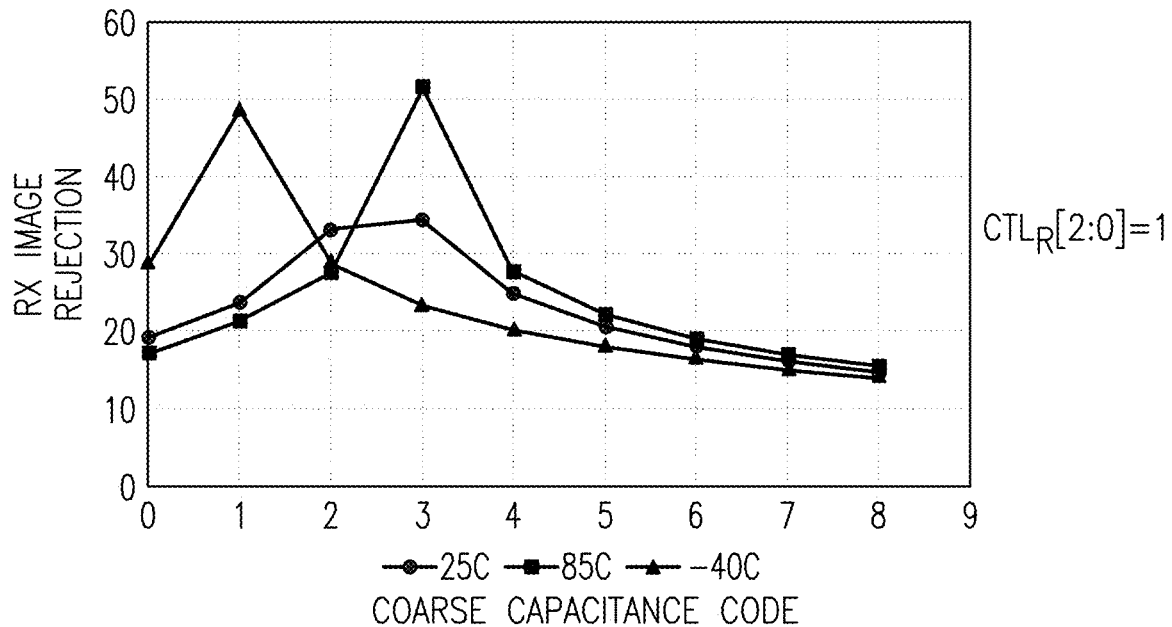
FIG. 4I is an example plot of receive image rejection versus coarse capacitance code for a resistance setting of one.
Figure 4J:
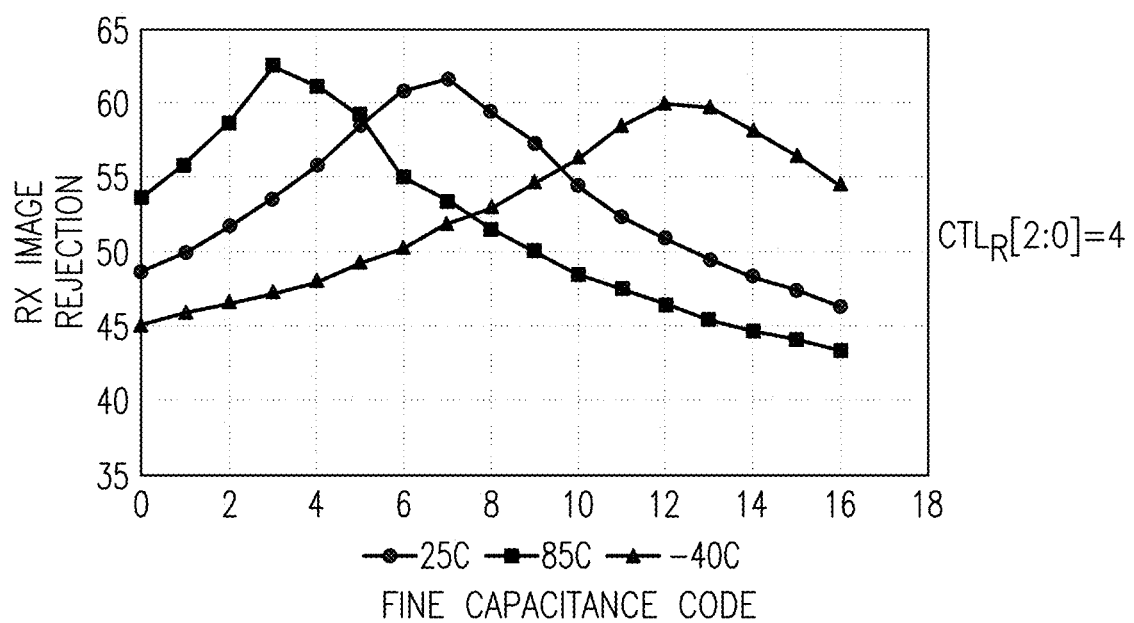
FIG. 4J is an example plot of receive image rejection versus fine capacitance code for a resistance setting of four.
Figure 4K:
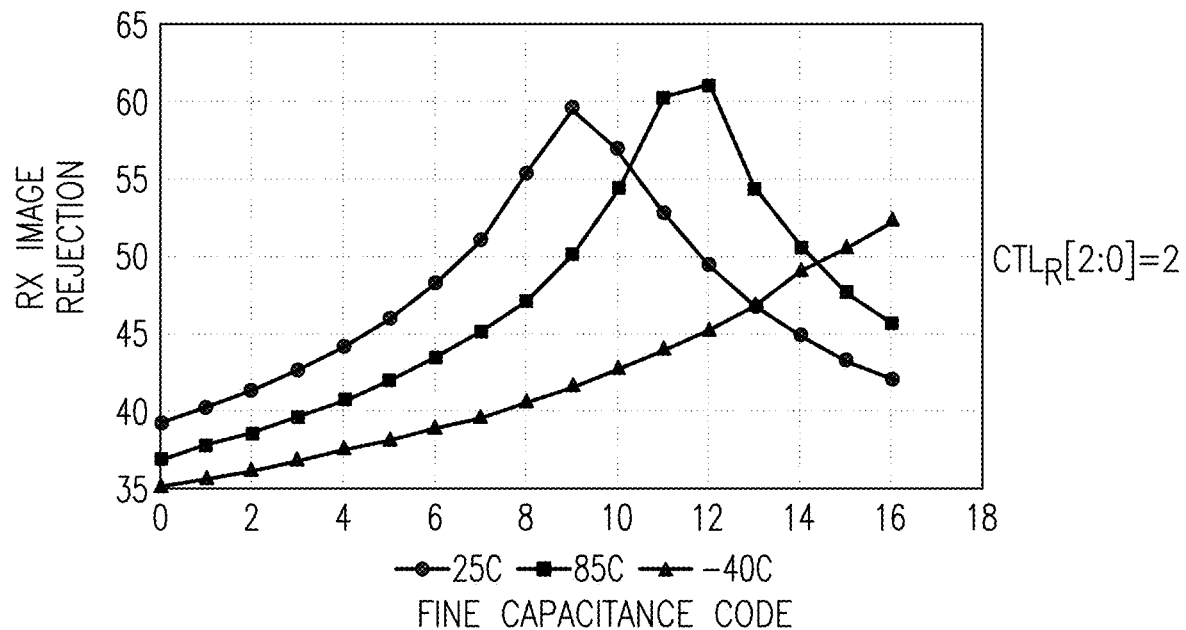
FIG. 4K is an example plot of receive image rejection versus fine capacitance code for a resistance setting of two.
Figure 4L:
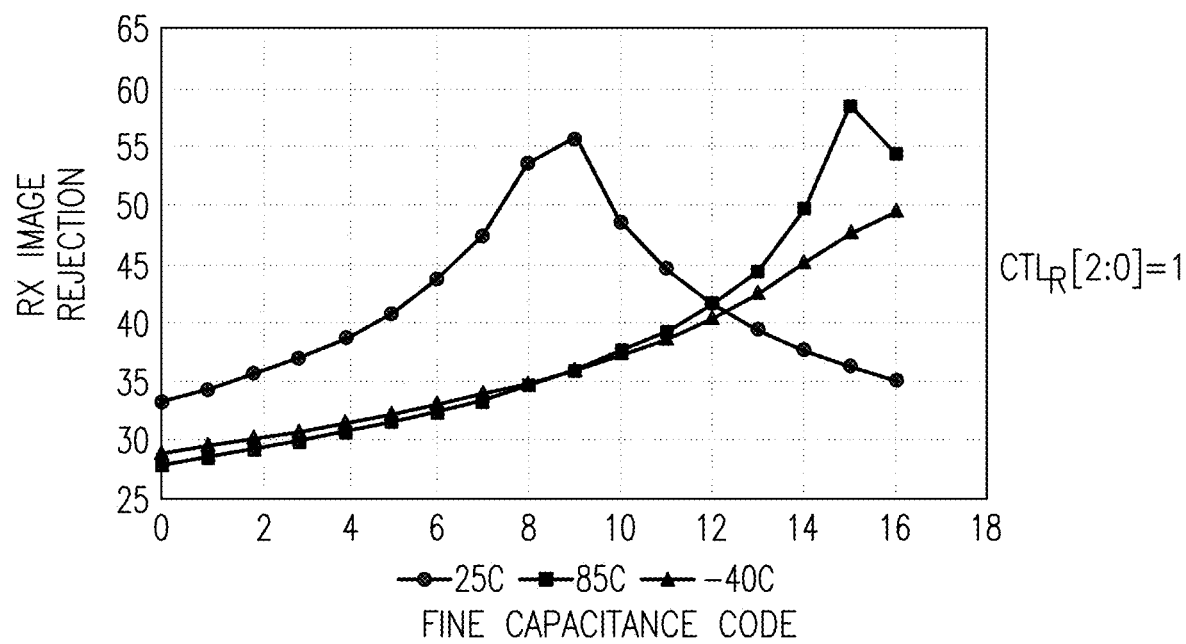
FIG. 4L is an example plot of receive image rejection versus fine capacitance code for a resistance setting of one.

FIG. 4F is an example plot of receive image rejection versus coarse capacitance code for a resistance setting of seven. FIG. 4G is an example plot of receive image rejection versus coarse capacitance code for a resistance setting of four. FIG. 4H is an example plot of receive image rejection versus coarse capacitance code for a resistance setting of two. FIG. 4I is an example plot of receive image rejection versus coarse capacitance code for a resistance setting of one. FIG. 4J is an example plot of receive image rejection versus fine capacitance code for a resistance setting of four. FIG. 4K is an example plot of receive image rejection versus fine capacitance code for a resistance setting of two. FIG. 4L is an example plot of receive image rejection versus fine capacitance code for a resistance setting of one.

In this example, 846 MHz quadrature LO is generated from an external VCO tuned to 846 MHz. Accordingly, the ratio of frequency of the quadrature clock signals to the VCO frequency is 1 to 1.

The R tuning allows a trade-off of input power with phase noise. Residual phase error is larger after coarse capacitor calibration when the resistor code is smaller. Fine capacitor tuning can be engaged to further improve receive image rejection.

Figure 5A:
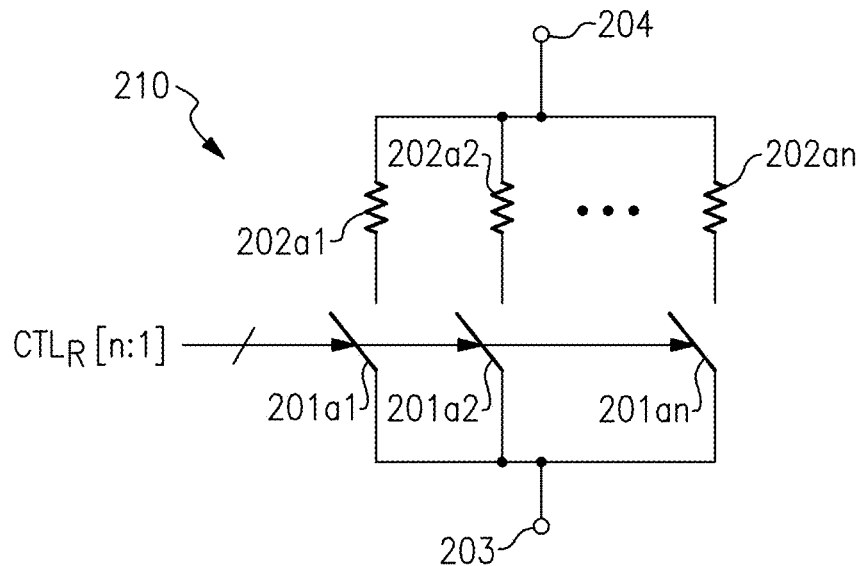
FIG. 5A is a schematic diagram of one example of a controllable resistor.

FIG. 5A is a schematic diagram of one example of a controllable resistor 210. The controllable resistor 210 includes a first terminal 203, a second terminal 204, and a plurality of series resistor/switch branches connected in parallel between the first terminal 203 and the second terminal 204. In this example, n series resistor/switch branches are included. The resistor/switch branches include switches 201a1, 201a2, . . . 201an in series with resistors 202a1, 202a2, . . . 202an, respectively. A digital control signal CTL$_R$[n:1] is used to turn on or off different combinations of the switches to achieve different resistor values.

Although one example of a controllable resistor is shown, the teachings herein are applicable to controllable resistors implemented in other ways.

Figure 5B:
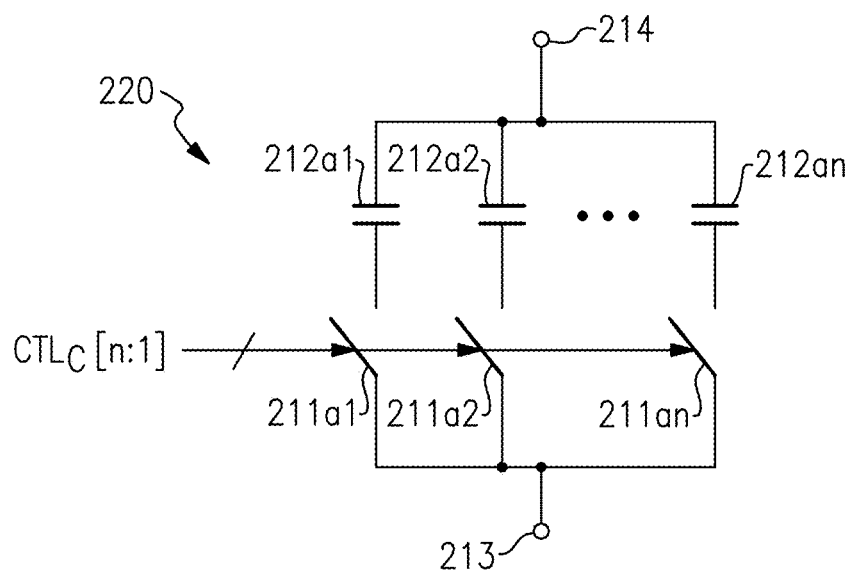
FIG. 5B is a schematic diagram of one example of a controllable capacitor.

FIG. 5B is a schematic diagram of one example of a controllable capacitor 220. The controllable capacitor 220 includes a first terminal 213, a second terminal 214, and a plurality of series capacitor/switch branches connected in parallel between the first terminal 213 and the second terminal 214. In this example, n series capacitor/switch branches are included. The capacitor/switch branches include switches 211a1, 211a2, . . . 211an in series with capacitors 212a1, 212a2, . . . 212an, respectively. A digital control signal CTL$_C$[n:1] is used to turn on or off different combinations of the switches to achieve different capacitor values.

Although one example of a controllable capacitor is shown, the teachings herein are applicable to controllable capacitors implemented in other ways.

CONCLUSION

The foregoing description may refer to elements or features as being "connected" or "coupled" together. As used herein, unless expressly stated otherwise, "connected" means that one element/feature is directly or indirectly connected to another element/feature, and not necessarily mechanically. Likewise, unless expressly stated otherwise, "coupled" means that one element/feature is directly or indirectly coupled to another element/feature, and not necessarily mechanically. Thus, although the various schematics shown in the figures depict example arrangements of elements and components, additional intervening elements, devices, features, or components may be present in an actual embodiment (assuming that the functionality of the depicted circuits is not adversely affected).

While certain embodiments have been described, these embodiments have been presented by way of example only, and are not intended to limit the scope of the disclosure. Indeed, the novel apparatus, methods, and systems described herein may be embodied in a variety of other forms; furthermore, various omissions, substitutions and changes in the form of the methods and systems described herein may be made without departing from the spirit of the disclosure. For example, while the disclosed embodiments are presented in a given arrangement, alternative embodiments may perform similar functionalities with different components and/or circuit topologies, and some elements may be deleted, moved, added, subdivided, combined, and/or modified. Each of these elements may be implemented in a variety of different ways. Any suitable combination of the elements and acts of the various embodiments described above can be combined to provide further embodiments. Accordingly, the scope of the present invention is defined only by reference to the appended claims.

Although the claims presented here are in single dependency format for filing at the USPTO, it is to be understood that any claim may depend on any preceding claim of the same type except when that is clearly not technically feasible.

What is claimed is:

1. A semiconductor die comprising:
a first pin configured to receive a non-inverted component of a differential input clock signal from an oscillator external to the semiconductor die;
a second pin configured to receive an inverted component of the differential input clock signal;
an oscillator interface circuit comprising a first controllable resistor and a first controllable capacitor connected in series between the first pin and the second pin, and a second controllable resistor and a second controllable capacitor connected in series between the second pin and the first pin, wherein the first controllable resistor connects to the first controllable capacitor at a first node, and the second controllable resistor connects to the second controllable capacitor at a second node; and
a clock processing circuit having a non-inverted in-phase (I) input connected to the first pin, a non-inverted quadrature-phase (Q) input connected to the first node, an inverted Q input connected to the second node, and an inverted I input connected to the second pin, the clock processing circuit comprising a first single-ended to differential conversion circuit configured to convert a single-ended I signal from one of the first pin or the second pin to a differential I clock signal, and a second single-ended to differential conversion circuit configured to convert a single-ended Q signal from one of the first node or the second node to a differential Q clock signal.

2. The semiconductor die of claim 1, wherein the clock processing circuit further comprises a first buffer having an input connected to the first pin and an output configured to provide a non-inverted I clock signal, and a second buffer having an input connected to the first node and an output configured to provide a non-inverted Q clock signal.

3. The semiconductor die of claim 2, wherein the clock processing circuit further comprises a third buffer having an input connected to the second node and an output configured to provide an inverted Q clock signal, and a fourth buffer having an input connected to the second pin and an output configured to provide an inverted I clock signal.

4. The semiconductor die of claim 2, wherein the first buffer includes a DC blocking capacitor, an inverter having an input connected to the first pin through the DC blocking capacitor, and a controllable feedback resistor connected between an output of the inverter and the input of the inverter.

5. The semiconductor die of claim 1, wherein the clock processing circuit further comprises a calibration circuit configured to control the first controllable resistor and the first controllable capacitor.

6. The semiconductor die of claim 5, further comprising a first mixer configured to receive the differential I clock signal and to output a first downconverted signal, a first analog-to-digital converter (ADC) configured to generate a first digital observation signal for the calibration circuit based on the first downconverted signal, a second mixer configured to receive the differential Q clock signal and to output a second downconverted signal, and a second ADC configured to generate a second digital observation signal for the calibration circuit based on the second downconverted signal.

7. The semiconductor die of claim 5, wherein the calibration circuit is further configured to control both the first controllable resistor and the second controllable resistor with a common resistance value, and to control both the first controllable capacitor and the second controllable capacitor with a common capacitance value.

8. The semiconductor die of claim 1, wherein the clock processing circuit further comprises a divider configured to divide one or more of an I clock signal received from the non-inverted I input or a Q clock signal received from the non-inverted Q input.

9. A method of clock processing, the method comprising:
  receiving, at a first pin of a semiconductor die, a non-inverted component of a differential input clock signal from an oscillator that is external to the semiconductor die;
  receiving, at a second pin of the semiconductor die, an inverted component of the differential input clock signal from the oscillator;
  processing the differential input clock signal using an oscillator interface circuit of the semiconductor die, the oscillator interface circuit including a first controllable resistor and a first controllable capacitor connected in series between the first pin and the second pin, and a second controllable resistor and a second controllable capacitor connected in series between the second pin and the first pin, wherein the first controllable resistor connects to the first controllable capacitor at a first node, and the second controllable resistor connects to the second controllable capacitor at a second node;
  generating a plurality of quadrature clock signals using a clock processing circuit having a non-inverted in-phase (I) input connected to the first pin, a non-inverted quadrature-phase (Q) input connected to the first node, an inverted Q input connected to the second node, and an inverted I input connected to the second pin; and
  converting a single-ended I signal from one of the first pin or the second pin to a differential I clock signal using a first single-ended to differential conversion circuit of the clock processing circuit, and converting a single-ended Q signal from one of the first node or the second node to a differential Q clock signal using a second single-ended to differential conversion circuit of the clock processing circuit.

10. The method of claim 9, further comprising using a plurality of buffers to buffer the first pin, the first node, the second node, and the second pin.

11. The method of claim 9, further comprising calibrating the first controllable resistor and the first controllable capacitor using a calibration circuit.

12. The method of claim 11, further comprising controlling both the first controllable resistor and the second controllable resistor with a common resistance value, and controlling both the first controllable capacitor and the second controllable capacitor with a common capacitance value.

13. A clock system comprising:
  an oscillator configured to provide a differential input clock signal; and
  a semiconductor die including a first pin configured to receive a non-inverted component of the differential input clock signal, a second pin configured to receive an inverted component of the differential input clock signal, and an oscillator interface circuit including a first controllable resistor and a first controllable capacitor connected in series between the first pin and the second pin, and a second controllable resistor and a second controllable capacitor connected in series between the second pin and the first pin, wherein the first controllable resistor connects to the first controllable capacitor at a first node, and the second controllable resistor connects to the second controllable capacitor at a second node, the semiconductor die further comprising a clock processing circuit having a non-inverted in-phase (I) input connected to the first pin, a non-inverted quadrature-phase (Q) input connected to the first node, an inverted Q input connected to the second node, and an inverted I input connected to the second pin, the clock processing circuit comprising a first single-ended to differential conversion circuit configured to convert a single-ended I signal from one of the first pin or the second pin to a differential I clock signal, and a second single-ended to differential conversion circuit configured to convert a single-ended Q signal from one of the first node or the second node to a differential Q clock signal.

14. The clock system of claim 13, wherein the clock processing circuit further comprises a first buffer having an input connected to the first pin and an output configured to provide a non-inverted I clock signal, and a second buffer having an input connected to the first node and an output configured to provide a non-inverted Q clock signal.

15. The clock system of claim 14, wherein the first buffer includes a DC blocking capacitor, an inverter having an input connected to the first pin through the DC blocking capacitor, and a controllable feedback resistor connected between an output of the inverter and the input of the inverter.

16. The clock system of claim 13, wherein the clock processing circuit further comprises a calibration circuit configured to control the first controllable resistor and the first controllable capacitor.

17. A semiconductor die comprising:
  a first pin configured to receive a non-inverted component of a differential input clock signal from an oscillator external to the semiconductor die;
  a second pin configured to receive an inverted component of the differential input clock signal;
  an oscillator interface circuit comprising a first controllable resistor and a first controllable capacitor connected in series between the first pin and the second pin, and a second controllable resistor and a second controllable capacitor connected in series between the second pin and the first pin, wherein the first controllable resistor connects to the first controllable capacitor at a first node, and the second controllable resistor connects to the second controllable capacitor at a second node; and
  a clock processing circuit having a non-inverted in-phase (I) input connected to the first pin, a non-inverted quadrature-phase (Q) input connected to the first node, an inverted Q input connected to the second node, and an inverted I input connected to the second pin, wherein the non-inverted I input of the clock processing circuit is directly connected to a first end of the first controllable resistor, the non-inverted Q input of the clock processing circuit is directly connected to a second end of the first controllable resistor, the inverted I input of the clock processing circuit is directly connected to a first end of the second controllable resistor, and the inverted Q input of the clock processing circuit is directly connected to a second end of the second controllable resistor.

* * * * *